United States Patent
Muramatsu et al.

(10) Patent No.: US 9,072,206 B2
(45) Date of Patent: Jun. 30, 2015

(54) LIGHT SOURCE DEVICE

(75) Inventors: Takaaki Muramatsu, Anjo (JP);
Kazumasa Kurokawa, Kariya (JP);
Masaki Itoh, Okazaki (JP)

(73) Assignee: DENSO CORPORATION, Kariya (JP)

( * ) Notice: Subject to any disclaimer, the term of this patent is extended or adjusted under 35 U.S.C. 154(b) by 864 days.

(21) Appl. No.: 12/661,054

(22) Filed: Mar. 10, 2010

(65) Prior Publication Data

US 2010/0232169 A1 Sep. 16, 2010

(30) Foreign Application Priority Data

Mar. 12, 2009 (JP) .................................. 2009-60281

(51) Int. Cl.
F21S 4/00 (2006.01)
H05K 3/32 (2006.01)
F21V 19/00 (2006.01)

(52) U.S. Cl.
CPC .................. *H05K 3/32* (2013.01); *F21V 19/001* (2013.01); *H05K 2201/10106* (2013.01); *H05K 2201/10606* (2013.01); *H05K 2201/10962* (2013.01)

(58) Field of Classification Search
CPC .................. F21V 19/001; H06K 2201/10106; H06K 3/32

USPC ............. 362/382, 249.01, 249.02, 23, 26, 27, 362/28, 29, 30

See application file for complete search history.

(56) References Cited

U.S. PATENT DOCUMENTS

| 5,367,530 | A | * | 11/1994 | Noishiki et al. | ............ 372/43.01 |
| 2007/0170452 | A1 | * | 7/2007 | Kurokawa et al. | ............ 257/99 |
| 2008/0316758 | A1 | | 12/2008 | Kurokawa | |
| 2009/0123116 | A1 | * | 5/2009 | Tanaka et al. | .................... 385/92 |

FOREIGN PATENT DOCUMENTS

| JP | 08-023002 | 1/1996 |
| JP | 2004-335740 | 11/2004 |
| JP | 2006-128415 | 5/2006 |

* cited by examiner

*Primary Examiner* — Anh Mai
*Assistant Examiner* — Jessica M Apenteng
(74) *Attorney, Agent, or Firm* — Harness, Dickey & Pierce, PLC

(57) ABSTRACT

A light source device includes a light source, a holder, and a lead board. The holder has a first face to hold the light source. The lead board has a first electrode connected to the light source through a solder, a second electrode to be connected to a circuit board, a first connector connected to the second electrode, and a second connector to connect the first electrode and the first connector. The first electrode and the first connector are exposed from the first face of the holder. The second connector is unable to be exposed from the first face of the holder.

19 Claims, 3 Drawing Sheets

LIGHT SOURCE DEVICE

CROSS REFERENCE TO RELATED APPLICATION

This application is based on Japanese Patent Application No. 2009-60281 filed on Mar. 12, 2009, the disclosure of which is incorporated herein by reference in its entirety.

BACKGROUND OF THE INVENTION

1. Field of the Invention

The present invention relates to a light source device.

2. Description of Related Art

JP-A-2009-4506, discloses a light emitting diode device as a light source device. The device includes a surface-mounted light emitting diode as a light source, and a holder to hold the light emitting diode. The holder is mounted on a circuit board, and a power is supplied to the light emitting diode from the circuit board through the holder.

The holder has a recess, and the diode is fitted into the recess. Therefore, a soldering face of the diode is recessed from a surface of the holder.

When the diode is soldered to the holder, a solder is printed on a lead of the holder. However, because the soldering face of the diode is located on a base of the recess, the printing of the solder is difficult to be performed. A soldering equipment such as masking or squeegee is difficult to be used, such that a soldering process may become complicated.

SUMMARY OF THE INVENTION

In view of the foregoing and other problems, it is an object of the present invention to provide a light source device.

According to a first example of the present invention, a light source device to be mounted on a circuit board includes a light source, a holder, a lead board. The holder has a first face to support the light source, and a second face to be mounted on the circuit board. The second face crosses with the first face. The lead board is arranged in the holder so as to electrically connect the circuit board and the light source. The lead board integrally has a first electrode, a second electrode, a first connector, and a second connector. The first electrode is connected to the light source through a solder, and is exposed from the first face of the holder. The second electrode is connected to the circuit board, and is exposed from the second face of the holder. The first connector is connected to the second electrode, and is exposed from the first face of the holder. The second connector connects the first electrode and the first connector, and is unable to be exposed from the first face of the holder.

Accordingly, the light source device can be easily produced.

According to a second example of the present invention, a light source device includes a light source, a holder board, a lead board, and a solder. The holder board has a flat face to support the light source. The lead board has an electrode exposed from the flat face of the holder board, and a first connector to be connected to outside so as to supply electricity to the light source. The solder is arranged between the light source and the electrode of the lead board. The flat face of the holder board is most adjacent to the light source than other part of the holder board in a thickness direction of the holder board.

Accordingly, the light source device can be easily produced.

BRIEF DESCRIPTION OF THE DRAWINGS

The above and other objects, features and advantages of the present invention will become more apparent from the following detailed description made with reference to the accompanying drawings. In the drawings.

DETAILED DESCRIPTION OF PREFERRED EMBODIMENT (First Embodiment)

Figure 1:
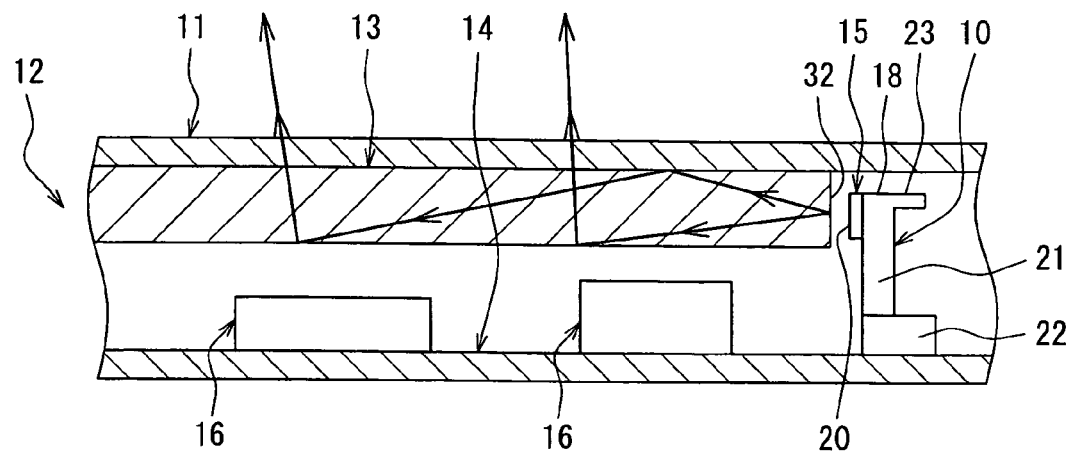
FIG. 1 is a schematic view illustrating a LED module according to a first embodiment, the LED module being mounted in a vehicle.

As shown in FIG. 1, a light emitting diode (LED) module 10 is mounted in a meter 12 of a vehicle. The LED module 10 is used for illuminating the meter 12 as a light source device. The meter 12 is located inside of an instrument panel (not shown) of the vehicle. The instrument panel is located in front of a driver seat of the vehicle.

The meter 12 has a dial plate 11, and the dial plate 11 has a variety of indicators and lamps. The dial plate 11 displays information necessary for a driver of the vehicle such as operation states of the vehicle. The LED module 10 emits light as a light source, and the light passes through the dial plate 11, such that the meter 12 is illuminated.

As shown in FIG. 1, the meter 12 further includes a light introducing board 13 and a circuit board 14.

The LED module 10 has a light emitting diode 15 (LED), and is mounted on the circuit board 14. The LED 15 emits light by being supplied with electricity from the circuit board 14. A light emitting direction of the LED 15 is approximately parallel to a surface of the circuit board 14.

The dial plate 11 is located on a front face of the meter 12 opposing to the driver of the vehicle. The dial plate 11 is made of resin, for example, and has a translucency and a thin board shape. A front or back face of the dial plate 11 has the indicators and the lamps through a printing, for example.

The light introducing board 13 is located on a back side of the dial plate 11. The light introducing board 13 is made of resin, for example, and has a translucency and a board shape. The light introducing board 13 is layered on the dial plate 11 so as to tightly contact with the dial plate 11. The light introducing board 13 introduces light emitted from the LED 15 to a back face of the dial plate 11. That is, the light introducing board 13 outputs light toward the dial plate 11.

The circuit board 14 is located to have a distance from a back face of the light introducing board 13. The circuit board 14 is made of glass epoxy resin, for example, and the LED module 10 and other electronic parts 16 are mounted on the circuit board 14. Thus, the circuit board 14 operates as an electric circuit of the meter 12.

When the LED module 10 is mounted on the circuit board 14, the LED 15 emits light leftward in FIG. 1. That is, a light emitting direction of the LED 15 is approximately perpendicular to a layer direction in which the dial plate 11 and the light introducing board 13 are layered. Light emitted from the LED 15 travels in arrow directions of FIG. 1.

A construction of the LED module 10 will be described with reference to FIGS. 2, 3 and 4.

The module 10 further includes a holder 18 and a lead 17, other than the LED 15. The LED 15 emits light as a light source, and has a surface-mounted chip shape, for example. The LED 15 has two electrodes 19 and a light emitting face 20.

The holder 18 supports the LED 15, and is mounted on the circuit board 14. The holder 18 determines a position of the LED 15 relative to the circuit board 14, because the LED 15 is distanced from the circuit board 14. The holder 18 is made of an insulating material such as resin.

The lead 17 is arranged in the holder 18, and electrically connects the circuit board 14 and the LED 15. Two of the leads 17 are arranged in the holder 18, because the LED 15 has two of the electrodes 19. When the holder 18 is formed by molding a resin material, the two leads 17 are arranged in a mold of the holder 18 in advance. Thus, the leads 17 can be arranged in the holder 18.

The LED 15 is electrically conducted with the circuit board 14 through the lead 17. A rigidity of the lead 17 is low, and the LED 15 cannot be supported only by the lead 17. Therefore, the holder 18 integrated with the lead 17 supports the LED 15.

Figure 3:
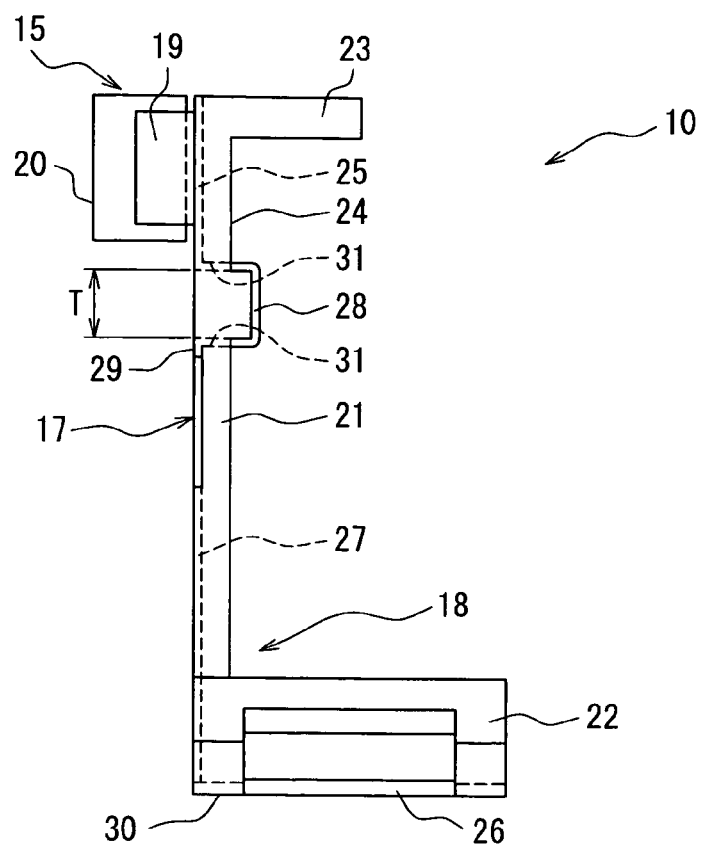
FIG. 3 is a side view illustrating the LED module.

As shown in FIG. 3, a side view of the holder 18 has an approximately L-shape. The holder 18 has a first portion 21 and a second portion 22. The LED 15 is mounted to the first portion 21, and the second portion 22 is mounted to a surface of the circuit board 14.

A set of the first portion 21 and the second portion 22 is defined for each of the two leads 17. The first portion 21 and the second portion 22 are integrally formed to define the holder 18. The second portions 22 corresponding to the two leads 17 are integrated into a single member. As shown in FIG. 2, a left side first portion 21 and a right side first portion 21 have approximately the same shape.

The first portion 21 has an approximately board shape, and extends in a direction approximately perpendicular to the circuit board 14 corresponding to an up-down direction of FIG. 3. The second portion 22 has an approximately board shape, and extends approximately parallel to the circuit board 14 corresponding to a left-right direction of FIG. 3.

A thickness direction of the first portion 21 and a thickness direction of the second portion 22 are approximately perpendicular to each other. A lower end of the first portion 21 and a left end of the second portion 22 are connected with each other, such that the first portion 21 and the second portion 22 are integrally formed.

A longitudinal dimension of the first portion 21 is set larger than an interval between the circuit board 14 and the light introducing board 13, as shown in FIG. 1. Thus, the LED 15 mounted on the first portion 21 can oppose to an inlet face 32 of the light introducing board 13.

A size of the second portion 22 is set in a manner that the module 10 becomes stable on the circuit board 14. Further, the size of the second portion 22 is set in a manner that the LED 15 and the light introducing board 13 have a predetermined relationship when the module 10 is mounted on the circuit board 14.

Due to the predetermined relationship, the LED 15 has a predetermined light-emitting direction and a predetermined light-emitting area, relative to the light introducing board 13. Further, light emitted from the LED 15 is incident into the inlet face 32 of the light introducing board 13 as much as possible. Light emitted from the LED 15 is restricted from being introduced into other area other than the inlet face 32.

As shown in FIG. 3, an upper end part of the first portion 21 integrally has a wall 23 extending opposite from the LED 15 in a thickness direction of the first portion 21. The first portion 21 has a front face 29 opposing to the LED 15, and a back face 24 opposite from the LED 15. The wall 23 and the second portion 22 extend from the back face 24 of the first portion 21 opposite from the LED 15.

The wall 23 is used in a process of mounting the module 10 on the circuit board 14. Specifically, when the module 10 is carried from a supplying base (not shown) to the circuit board 14, the module 10 is adsorbed on an edge of a vacuum nozzle (not shown). A flat face larger than the edge of the vacuum nozzle is necessary for the module 10, such that a smooth transportation of the module 10 can be performed. Due to the wall 23, an area of an upper end face of the holder 18 can be increased. Therefore, the vacuum nozzle can easily and accurately adsorb the module 10 at the supplying base.

The lead 17 is made of a conductive material such as copper-based metal. As shown in FIG. 4, the lead 17 is produced by bending a board of the copper-based metal into an approximately L-shape. The lead 17 is a board-shaped member integrally having a first electrode 25, a second electrode 26, a first connector 27, and a second connector 28.

Figure 4:
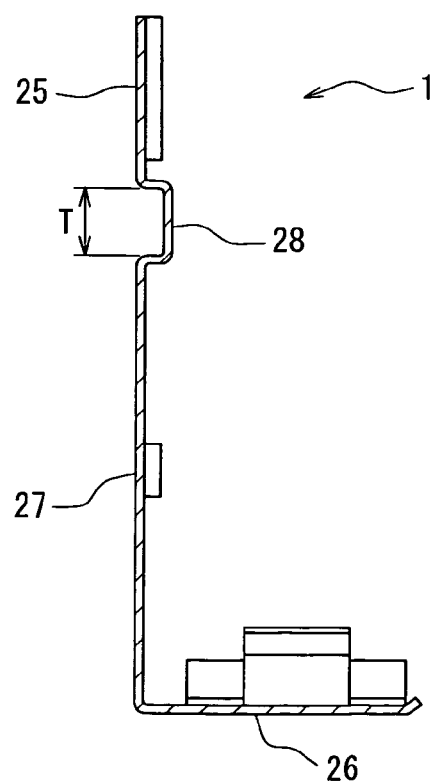
FIG. 4 is a cross-sectional view taken along a line IV-IV of FIG. 2.

As shown in FIG. 4, the first electrode 25 is located on an upper end of the lead 17, and extends in an up-down direction. The second electrode 26 is located on a lower end of the lead 17, and extends in a left-right direction. The first connector 27 extends upward from a left end of the second electrode 26. The second connector 28 extends in the up-down direction so as to connect a lower end of the first electrode 25 and an upper end of the first connector 27.

As shown in FIG. 3, the first electrode 25 is connected to the electrode 19 of the LED 15. The first electrode 25 is arranged on the front face 29 of the first portion 21, and is located on an upper end of the holder 18. The first electrode 25 has a board shape, because the first electrode 25 is a part of the lead 17. The first electrode 25 extends along the front face 29 of the first portion 21. Therefore, the first electrode 25 is exposed from a surface of the holder 18. The electrode 19 of the LED 15 is electrically connected to the first electrode 25 of the lead 17 through a solder.

An upper end face of the LED 15 and an upper end face of the holder 18 are located on the same plane. A position of the LED 15 is set relative to the holder 18, after the LED 15 is mounted on the first electrode 25 of the lead 17. The LED 15 is arranged on the holder 18 so as not to protrude from the upper end face of the holder 18, after the LED 15 is mounted to the lead 17.

When the LED 15 is mounted on the front face 29 of the first portion 21 of the holder 18, and when the module 10 is mounted on the circuit board 14, the light emitting direction of the LED 15 corresponds to a surface direction of the dial plate 11, as shown in FIG. 1. That is, the light emitting direction corresponds to a surface direction of the circuit board 14.

As shown in FIG. 3, the second electrode 26 of the lead 17 is arranged on a lower face 30 of the second portion 22 of the holder 18, and is to be mounted on the circuit board 14. The second electrode 26 has a board shape, and extends approximately parallel to the lower face 30 of the second portion 22. Therefore, the second electrode 26 is exposed from a surface of the holder 18. Further, the front face 29 of the first portion 21 and the lower face 30 of the second portion 22 are approximately perpendicular to each other, because the first portion 21 and the second portion 22 are approximately perpendicular to each other.

The first connector 27 is arranged to extend approximately parallel to the front face 29 of the first portion 21, and is exposed from a surface of the holder 18. Further, the first connector 27 and the first electrode 25 are arranged on the same front face 29 of the first portion 21. The lower end of the first connector 27 is connected to the left end of the second electrode 26. A connecting position between the second electrode 26 and the first connector 27 corresponds to a bending position of the holder 18.

The second connector 28 is located between the first electrode 25 and the first connector 27, and connects the first electrode 25 and the first connector 27. The second connector 28 is arranged not to be exposed from the front face 29 of the first portion 21, and is arranged to be exposed from the back face 24 of the first portion 21. The second connector 28 has a board shape, and is arranged approximately parallel to the back face 24 of the first portion 21.

As shown in FIG. 4, the second connector 28 has a recess recessed from the first electrode 25 and the first connector 27 in the thickness direction. The first electrode 25 and the first connector 27 are arranged on the same plane. In contrast, the second connector 28 is not arranged on the plane on which the first electrode 25 and the first connector 27 are arranged. A depth dimension of the recess of the second connector 28 is set larger than a thickness dimension of the first portion 21.

Figure 2:
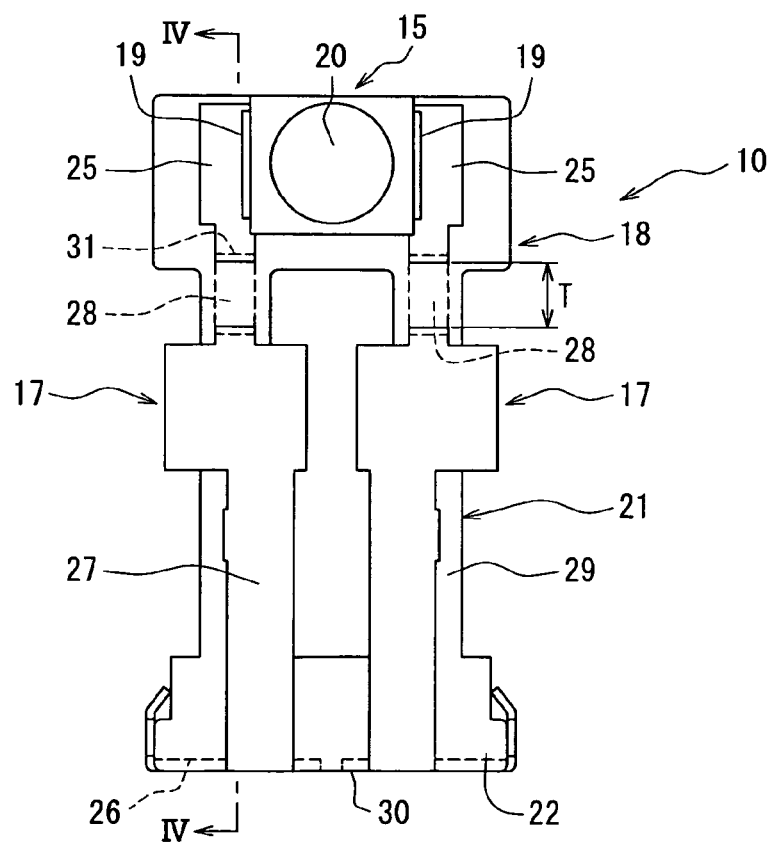
FIG. 2 is a front view illustrating the LED module.

As shown in FIGS. 2 and 3, the holder 18 has an opening 31 passing through the thickness direction. The opening 31 is located at a position corresponding to the second connector 28. The second connector 28 passes through the opening 31 in the thickness direction of the holder 18. When the first electrode 25 and the first connector 27 are arranged on the front face 29 of the first portion 21, the second connector 28 is exposed from the back face 24 of the first portion 21 of the holder 18.

As shown in FIGS. 2 and 3, an interval T is defined between the first electrode 25 and the first connector 27 in the up-down direction. The interval T is set in a manner that a solder is unable to reach the first connector 27 over the front face 29 of the first portion 21 exposed between the first electrode 25 and the first connector 27, when the electrode 19 of the LED 15 is soldered on the first electrode 25.

The interval T defined between the first electrode 25 and the first connector 27 corresponds to a dimension T of the second connector 28 in the up-down direction of FIG. 4. The dimension T of the second connector 28 is set in a manner that the solder applied to the first electrode 25 is unable to reach the first connector 27.

According to the first embodiment, the first electrode 25 and the first connector 27 are exposed from the front face 29 of the first portion 21 of the holder 18. The lower face 30 of the second portion 22 is crossed with the front face 29 of the first portion 21. The front face 29 of the holder 18 is located most close to the LED 15 than other part of the holder 18 in a thickness direction of the first portion 21 of the holder 18. Therefore, a solder printing is not obstructed by the holder 18, when the solder printing is performed on the first electrode 25 so as to mount the LED 15. Thus, the solder printing can be easily performed on the first electrode 25, because a soldering equipment can be flexibly used.

Further, the second connector 28 is located between the first electrode 25 and the first connector 27, and is not exposed from the front face 29 of the first portion 21. That is, the front face 29 of the first portion 21 is exposed between the first electrode 25 and the first connector 27. The lead 17 is exposed from the front face 29 of the holder 18 in an area except for the recess of the second connector 28. The recess has a size to disable the solder to reach the exposed lead 17. Therefore, when a solder printed on the first electrode 25 is melted, the solder can be restricted from flowing out of the first electrode 25, due to the front face 29 of the first portion 21. Thus, the flowing-out of the solder can be reduced, such that a predetermined soldering can be achieved between the LED 15 and the first electrode 25.

The LED 15 can be easily soldered, because the holder 18 does not have a projection protruding from a soldering face of the LED 15. Further, the second connector 28 of the lead 17 is buried in the holder 18 made of resin. That is, not all of the lead 17 is exposed from the holder 18. Thus, when the LED 15 is soldered on the first electrode 25, the solder can be restricted from flowing on the lead 17.

Not only the first electrode 25 and the second electrode 26 but also the first connector 27 is exposed from the surface of the holder 18. Therefore, heat transmitted from the LED 15 to the first connector 27 can be emitted to outside air. Thus, heat-emitting performance of the module 10 can be increased.

The second connector 28 is not completely buried in the holder 18, and is exposed from the back face 24 of the first portion 21. Therefore, heat transmitted from the LED 15 to the second connector 28 can be emitted to outside air. Thus, heat-emitting performance of the module 10 can be more increased.

The surface-mounted LED 15 is used as a light source, and a size of the LED 15 is relatively small. Therefore, a size of the module 10 can be made smaller.

As shown in FIG. 3, the upper end face of the LED 15 and the upper end face of the holder 18 are arranged on approximately the same plane. As shown in FIG. 1, the light emitting face 20 of the LED 15 is located to oppose to the inlet face 32 of the light introducing board 13. Further, an outline of the light emitting face 20 of the LED 15 is locate inside of an outline of the inlet face 32 of the light introducing board 13. Therefore, light emitted from the LED 15 is made to be incident into the light introducing board 13 as much as possible.

The upper end face of the holder 18 can oppose to the inlet face 32 of the light introducing board 13. The upper end face of the holder 18 does not have a projection protruding toward the dial plate 11. That is, the module 10 does not intervene with the dial plate 11, even when the dial plate 11 and the light introducing board 13 are tightly layered with each other. Therefore, the dial plate 11 and the light introducing board 13 can be located to tightly contact with each other.

The first electrode 25 is exposed from the surface of the holder 18. Therefore, a connection connecting the electrode 19 of the LED 15 and the first electrode 25 can be easily checked with eyes. That is, the solder arranged between the electrode 19 of the LED 15 and the first electrode 25 can be easily checked.

(Second Embodiment)

Figure 5:
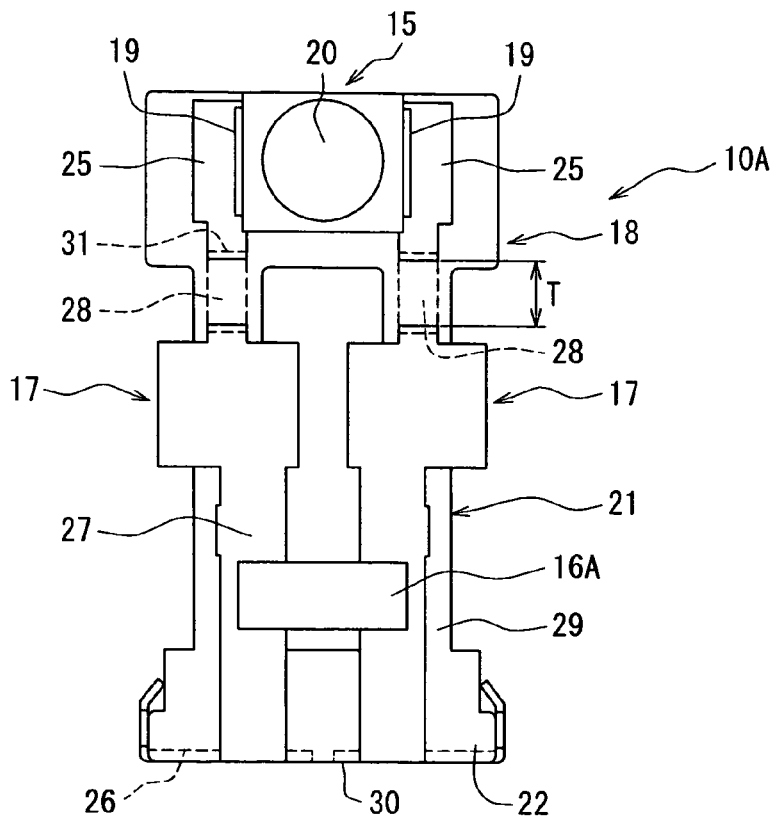
FIG. 5 is a front view illustrating a LED module according to a second embodiment.
Figure 6:
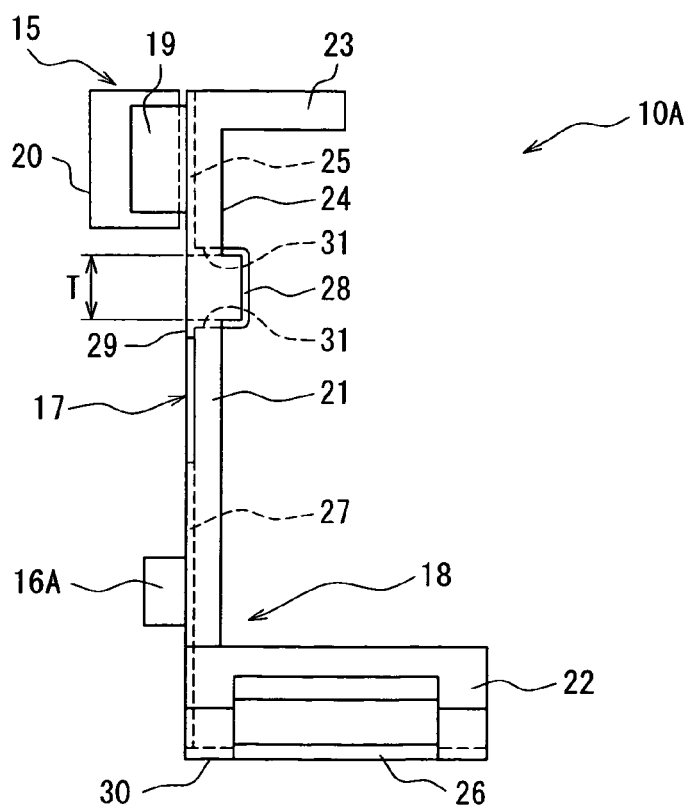
FIG. 6 is a side view illustrating the LED module of the second embodiment.

A light emitting diode (LED) module 10A of a second embodiment will be described with reference to FIGS. 5 and 6. The LED module 10A further includes an electronic part 16A mounted on the first connector 27, compared with the LED module 10 of the first embodiment.

The electronic part 16A is a resistor, a capacitor, or an integrated circuit (IC), for example, to operate by being supplied with electricity. The electronic part 16A has an electrode (not shown), similarly to the LED 15. The electrode of the electronic part 16A is electrically connected to the first connector 27 of the lead 17 through a soldering.

According to the second embodiment, the electronic part 16A is connected to the first connector 27, and the first connector 27 is exposed from the front face 29 of the first portion 21. The first electrode 25 and the first connector 27 are arranged on the same front face 29 of the first portion 21. Therefore, a printing of a solder on the first connector 27 can be performed at the same time as a printing of a solder on the first electrode 25. Thus, additional process for printing a solder on the first connector 27 is not needed, such that the electronic part 16A can be connected to the first connector 27 without the additional process.

The module 10A has two of the leads 17 to supply electricity for the LED 15. However, when the first connector 27 is used for the electronic part 16A, the first connector 27 may be defined to operate as a circuit, and a plurality of the electronic parts 16A may be mounted on the circuit. That is, the first portion 21 may be defined to operate as a part of the circuit board 14. Thus, a capacity of the circuit board 14 can be increased.

(Other Embodiment)

The light source is not limited to the surface-mounted LED 15. The light source may be other type LED, or a light emitting element such as a filament. Alternatively, an ultraviolet ray generated by a discharging is applied to a fluorescent member so as to be converted into a visible ray, in the module 10, 10A.

The lead 17 is formed by bending a board-shaped member. Alternatively, the lead 17 is not limited to be formed by practically bending.

The second connector 28 is not limited to be exposed from the back face 24 of the first portion 21. Alternatively, the second connector 28 may be completely buried in the holder 18.

Such changes and modifications are to be understood as being within the scope of the present invention as defined by the appended claims.

What is claimed is:

1. A light source device to be mounted on a circuit board, the light source device comprising:
   a light source;
   a holder having
      a first face to support the light source, the first face being flat, and
      a second face to be mounted on the circuit board, the second face crossing with the first face; and
   a single piece lead board mounted to the holder so as to electrically connect the circuit board and the light source, wherein
   the single piece lead board has
      a first electrode connected to the light source through a solder, the first electrode being exposed from the first face of the holder,
      a second electrode connected to the circuit board, the second electrode being exposed from the second face of the holder,
      a first connector connected to the second electrode, the first connector being exposed from the first face of the holder, and
      a second connector to connect the first electrode and the first connector, the second connector being unable to be exposed from the first face of the holder; wherein
   the single piece lead board is made of a single piece board-shaped member constructed to define the first electrode, the second electrode, the first connector and the second connector.

2. The light source device according to claim 1, wherein the holder is a holder board having a board shape,
   the first face of the holder corresponds to a first face of the holder board, and
   the second connector is exposed from a second face of the holder board opposite from the first face of the holder board.

3. The light source device according to claim 2, wherein the first face of the holder board is a flat face to support the light source;
   the flat face of the holder board is most adjacent to the light source than other part of the holder board in a thickness direction of the holder board.

4. The light source device according to claim 3, wherein the lead board is a single piece electrically conductive component.

5. The light source device according to claim 3, wherein the second connector has a recess recessed from the flat face of the holder board in the thickness direction of the holder board, and
   the lead board is exposed from the flat face of the holder board in all area except for the second connector.

6. The light source device according to claim 5, wherein the second connector has a dimension to disable the solder to reach the first connector.

7. The light source device according to claim 5, wherein the second connector is exposed from a back face of the holder board opposite from the flat face, and
   the recess of the second connector has a depth larger than a thickness of the holder board.

8. The light source device according to claim 1, wherein the light source is a surface-mounted type light emitting diode.

9. The light source device according to claim 1, further comprising:
   an electronic part electrically connected to the first connector through a solder, wherein
   the solder arranged between the first electrode and the light source, and the solder arranged between the first connector and the electronic part are configured to be printed at the same time.

10. The light source device according to claim 1, wherein the lead board is a single piece electrically conductive component.

11. The light source device according to claim 1, wherein the second face of the holder directly contacts the circuit board.

12. A light source device in combination with a circuit board, the combination comprising:
    a light source,
    a holder including a first face supporting the light source and a second face mounted to the circuit board, the second face crossing with the first face;
    a single piece lead board mounted to the holder, the single piece lead board electrically connecting the circuit board and the light source, the single piece lead board including a first electrode connected to the light source, a second electrode connected to the circuit board, a first connector connected directly to the second electrode, and a second connector connected directly to the first electrode; wherein
    the first connector extends directly between the second electrode and the second connector and is connected directly to the second connector; and
    the second connector extends directly between the first electrode and the first connector.

13. The combination according to claim 12, wherein the second connector extends through an opening defined by the holder.

14. The combination according to claim 12, wherein the lead board is a single piece electrically conductive component.

15. The combination according to claim 12, wherein:
    the first electrode is attached directly to the first face of the holder;

the second electrode is attached directly to the second face of the holder;

the first connector is attached directly to the first face of the holder; and the second connector extends through an opening defined by the holder and extends past the first face and the second face of the holder.

16. The combination according to claim 12, wherein the holder is a holder board having a board shape, the first face of the holder corresponds to a first face of the holder board, and the second connector is exposed from a second face of the holder board opposite from the first face of the holder board.

17. The combination according to claim 12, wherein the light source is a surface-mounted type light emitting diode.

18. The combination according to claim 12, further comprising:

an electronic part electrically connected to the first connector through a solder, wherein the solder arranged between the first electrode and the light source, and the solder arranged between the first connector and the electronic part are configured to be printed at the same time.

19. The combination according to claim 12, wherein the second face of the holder directly contacts the circuit board.

\* \* \* \* \*